United States Patent
Davies et al.

(10) Patent No.: US 11,921,172 B2
(45) Date of Patent: Mar. 5, 2024

(54) MAGNETORESISTIVE SENSOR ELEMENT WITH SYNTHETIC ANTIFERROMAGNET BIASING

(71) Applicant: NVE Corporation, Eden Prairie, MN (US)

(72) Inventors: Joe Davies, Minneapolis, MN (US); Justin Watts, Minneapolis, MN (US)

(73) Assignee: NVE Corporation, Eden Prairie, MN (US)

( * ) Notice: Subject to any disclaimer, the term of this patent is extended or adjusted under 35 U.S.C. 154(b) by 111 days.

(21) Appl. No.: 17/454,470

(22) Filed: Nov. 10, 2021

(65) Prior Publication Data

US 2023/0145573 A1  May 11, 2023

(51) Int. Cl.
| | |
|---|---|
| G01R 33/09 | (2006.01) |
| H01F 10/32 | (2006.01) |
| H10N 50/01 | (2023.01) |
| H10N 50/10 | (2023.01) |

(52) U.S. Cl.
CPC ....... *G01R 33/093* (2013.01); *H01F 10/3272* (2013.01); *H10N 50/01* (2023.02); *H10N 50/10* (2023.02)

(58) Field of Classification Search
CPC .......... H01F 10/3272; G01R 33/093
See application file for complete search history.

(56) References Cited

U.S. PATENT DOCUMENTS

| | | | |
|---|---|---|---|
| 2002/0131219 A1 | 9/2002 | Mack et al. | |
| 2007/0171581 A1* | 7/2007 | Childress | G01R 33/093 360/324.12 |
| 2016/0359103 A1* | 12/2016 | Fermon | G11B 5/3909 |
| 2019/0259520 A1* | 8/2019 | Lassalle-Balier | H01F 10/3263 |

FOREIGN PATENT DOCUMENTS

EP  3531153 A1  8/2019

OTHER PUBLICATIONS

Extended European Search Report dated Apr. 4, 2023, received for corresponding European Application No. 22275142.2, pp. 7.

* cited by examiner

*Primary Examiner* — Alesa Allgood
(74) *Attorney, Agent, or Firm* — Kinney & Lange, P.A.

(57) ABSTRACT

Apparatus and associated methods relate to a magnetoresistive sensor element with synthetic antiferromagnetic biasing structure separated, by a non-magnetic tuning spacer, from a free ferromagnetic layer of a TMR/GMR sensor. The synthetic antiferromagnetic biasing structure includes first and second ferromagnetic layers separated from one another by a synthetic antiferromagnetic spacer. The synthetic antiferromagnetic biasing structure is biased during manufacture and pinned via exchange coupling with an adjacent antiferromagnetic layer. The synthetic antiferromagnetic biasing structure biases the free ferromagnetic layer via tuned exchanged coupling via relative proximity controlled by thickness of the non-magnetic tuning spacer.

16 Claims, 5 Drawing Sheets

MAGNETORESISTIVE SENSOR ELEMENT WITH SYNTHETIC ANTIFERROMAGNET BIASING

BACKGROUND

Magnetoresistive sensors can measure metrics of a magnetic field based on either giant magnetoresistive (GMR) or tunneling magnetoresistive (TMR) principles of operation. Electrical resistance of such magnetoresistive sensors varies in response to the relative orientation between the magnetic moments of two magnetic layers in close proximity with one another. Typically, one of the two magnetic layers (referred to as the reference ferromagnetic) has a magnetic moment that is pinned in a particular orientation, while the other magnetic layer (referred to as the sensing ferromagnet) is free to align with an externally applied magnetic field. The reference layer's magnetization direction is typically fixed or set (i.e., locked or frozen) during manufacture and does not significantly change in response to an externally applied magnetic field that is within the sensor's operating specifications. The magnetization directions and magnitudes of layers with fixed or set magnetic moments are established by forming such layers within an external magnetic field at temperatures above the blocking temperatures of such layers. The magnetization directions and magnitudes of such layers are then frozen by lowering the temperature below the blocking temperature. The sensing layer has a magnetic condition that readily changes in response to the externally applied magnetic field.

Because such magnetoresistive sensors include various layers that have magnetic moments, there is typically significant magnetic interaction between layers. Some of these interactions are by design, such as, for example proximate layers that are coupled to one another via exchange interaction. Others of these interactions can be undesirable, such as, for example, edge fields emanating from edges of layers with magnetic moments. Corralling such magnetic fields so as to ensure that these fields do not have undesirable interaction with other magnetic layers would be welcome. Furthermore, providing a predetermined or tunable magnetic bias to the sensing magnetic layers would also be welcome so as to provide better repeatability and controlled performance.

SUMMARY

Apparatus and associated methods relate to a magnetoresistive sensor element with synthetic antiferromagnet biasing. The magnetoresistive sensor element includes a GMR/TMR sensor, a synthetic antiferromagnetic biasing structure, and an exchange-tuning spacer. The GMR/TMR sensor includes a sensing ferromagnetic layer formed on an opposite side of a spacer layer from a reference structure. The synthetic antiferromagnetic biasing structure includes a sense pinned ferromagnetic layer formed on an opposite side of a sense non-magnetic spacer from a sense biasing ferromagnetic layer. The exchange-tuning spacer is sandwiched between the sensing ferromagnetic layer and the sense biasing ferromagnetic layer.

Some embodiments relate to a method of manufacturing a synthetic antiferromagnet biased magnetoresistive sensor. The method includes: depositing a reference ferromagnetic structure; depositing a spacer upon the reference structure; depositing a sensing ferromagnetic layer on the spacer; depositing an exchange-tuning spacer on the sensing ferromagnetic layer; depositing a synthetic antiferromagnetic biasing structure on the exchange-tuning spacer; and depositing a capping layer on the synthetic antiferromagnetic biasing structure.

DETAILED DESCRIPTION

Apparatus and associated methods relate to a TMR/GMR magnetoresistive sensor element with a synthetic antiferromagnetic biasing structure separated from a sensing ferromagnetic layer by a non-magnetic exchange-tuning spacer. The synthetic antiferromagnetic biasing structure includes two ferromagnetic layers separated from one another by a non-magnetic spacer. The synthetic antiferromagnetic biasing structure is biased during manufacture and pinned via exchange coupling with an adjacent antiferromagnetic layer. The synthetic antiferromagnetic biasing structure biases the sensing ferromagnetic layer through an exchange interaction that can be tuned via the thickness of the non-magnetic exchange-tuning spacer.

Figure 1:
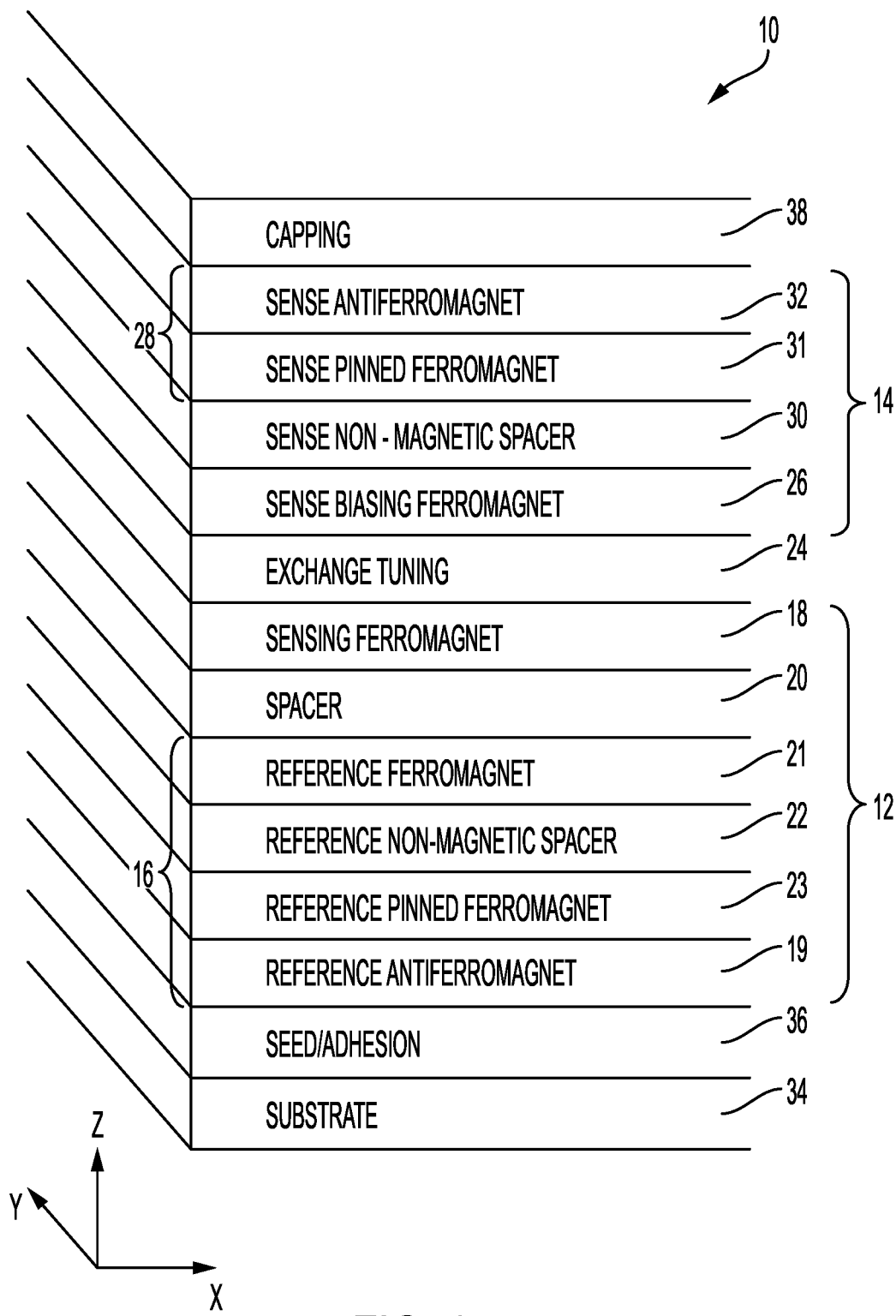
FIG. 1 is a perspective cross-sectional view of the core layers of a TMR/GMR sensor with synthetic antiferromagnetic biasing.

FIG. 1 is a perspective cross-sectional view of the core layers of a TMR/GMR sensor with synthetic antiferromagnetic biasing. In FIG. 1, synthetic antiferromagnet biased magnetoresistive sensor 10 includes magnetoresistive sensing structure 12 separated from synthetic antiferromagnetic biasing structure 14 by exchange-tuning spacer 24. Magnetoresistive sensing structure 12 is configured to sense a magnetic field. Synthetic antiferromagnetic biasing structure 14 is configured to generate a magnetic field so as to provide a bias to magnetoresistive sensing structure 12 via exchange-tuning spacer 24.

Magnetoresistive sensing structure 12 includes reference structure 16, sensing ferromagnetic layer 18, and spacer layer 20. Reference structure 16 includes reference antiferromagnetic layer 19, reference pinned ferromagnetic layer 23, reference non-magnetic spacer 22, and reference ferromagnetic layer 21. In the depicted embodiment, reference antiferromagnetic layer 19 is immediately adjacent (i.e., in direct contact with) reference pinned ferromagnetic layer 23. In some embodiments, reference structure 16 can omit reference non-magnetic spacer 22 and reference pinned ferromagnetic layer 23. In such embodiments, for example, it might not be critical to minimize stray fields generated by reference ferromagnetic layer 21. In some embodiments, reference antiferromagnetic layer 19 can also be omitted. In such embodiments, the preferential orientation of reference ferromagnetic layer 21 could be set by thickness, shape, or other forms of strong magnetic anisotropies, such as, for example, those in alternating ferromagnetic/non-magnetic multilayer stacks with perpendicular magnetic anisotropy. In some embodiments, a difference between the blocking temperatures of reference structure 16 and synthetic antiferromagnetic biasing structure 14 is greater than 30° C. Such a difference permits fixing of the magnetic moment of the second deposited of the structures 14 and 16 without disturbing the magnetic moment of the first deposited of the structures 14 and 16.

Spacer layer 20 is sandwiched between (i.e., in direct contact with each of) reference structure 16 and sensing ferromagnetic layer 18. In some embodiments, spacer layer 20 is conductive. Such conductive spacer material selection results in magnetoresistive sensing structure 12 capable of Giant Magnetoresistive (GMR) sensing operation. In other embodiments, spacer layer 20 is insulative. Such insulative spacer material selection results in magnetoresistive sensing structure 12 capable of Tunnel Magnetoresistive (TMR) sensing operation. In either case, magnetoresistive sensing structure 12 has a resistance that changes in response to changes in an external magnetic field.

Typically, electrical resistance Rz of magnetoresistive sensing structure 12 is detected along a vertical dimension Z. Such electrical resistance Rz of magnetoresistive sensing structure 12 is indicative of the relative alignment of magnetic moments of reference ferromagnetic layer 21 and sensing ferromagnetic layer 18. Electrical resistance Rz of magnetoresistive sensing structure 12 is relatively low when the magnetic moments of both reference ferromagnetic layer 21 and sensing ferromagnetic layer 18 are oriented parallel to one another. Electrical resistance Rz of magnetoresistive sensing structure 12 is relatively high when the magnetic moments of reference ferromagnetic layer 21 and sensing ferromagnetic layer 18 are oriented anti-parallel to one another. The descriptors "relatively-high resistance" and "relatively-low resistance" are used in comparison with each other. Electrical resistance Rz of magnetoresistive sensing structure 12 is relatively high for parallelly-aligned magnetic moments of reference ferromagnetic layer 21 and sensing ferromagnetic layer 18 in comparison with electrical resistance Rz of magnetoresistive sensing structure 12 for anti-parallelly-aligned magnetic moments of reference ferromagnetic layer 21 and sensing ferromagnetic layer 18.

The magnetic moments of the layer(s) composing reference structure 16 have a fixed or pinned orientation. Such pinning is typically performed by forming a ferromagnetic layer proximate a pinning layer, such as, for example, locating reference pinned ferromagnetic layer 23 adjacent to reference antiferromagnetic layer 19. Reference antiferromagnetic layer 19 pins an orientation of the magnetic moment of reference pinned ferromagnetic layer 23, thereby functioning as a pinning layer. With appropriate choice of material and thickness for reference non-magnetic spacer layer 22, reference pinned ferromagnetic layer 23 will then act to strongly bias the orientation of the magnetic moment of reference ferromagnetic layer 21 in an anti-parallel manner, thus forming a synthetic antiferromagnetic structure for reference structure 16. Coupling between reference pinned ferromagnetic layer 23 and reference ferromagnetic layer 21 is called Ruderman-Kittel-Kasuya-Yoshida (RKKY) exchange coupling. Such RKKY exchange coupling occurs between ferromagnetic layers separated by ultra-thin non-magnetic spacers, such as reference non-magnetic spacer layer 22.

The orientation of the magnetic moments of the constituent layers of reference structure 16 do not significantly change in response to an external magnetic field (for typical operational magnitudes of such external magnetic fields). Such strong pinning can be provided by the exchange interaction between reference antiferromagnetic layer 19 and reference pinned ferromagnetic layer 23 adjacent thereto. In contrast to the strongly pinned condition of reference ferromagnetic layer 21, the orientation of the magnetic moment of sensing ferromagnetic layer 18 can change in response to even small changes in an external magnetic field. When the external magnetic field aligns the magnetic orientation of sensing ferromagnetic layer 18 parallel to the magnetic orientation of reference ferromagnetic layer 21, electrical resistance Rz of magnetoresistive sensing structure 12 reaches a minimum value. When the external magnetic field aligns the magnetic orientation of sensing ferromagnetic layer 18 antiparallel to the magnetic orientation of reference ferromagnetic layer 21, resistance Rz of magnetoresistive sensing structure 12 reaches a maximum value.

Synthetic antiferromagnetic biasing structure 14 includes exchange-tuning spacer 24, sense biasing ferromagnetic layer 26, sense non-magnetic spacer 30, and biasing pinned magnetic structure 28. The magnetic moment of biasing pinned magnetic structure 28 has a fixed or pinned orientation. Such pinning can again be performed by locating a ferromagnetic layer proximate a pinning layer, such as, for example, locating sense pinned ferromagnetic layer 31 adjacent (i.e., in direct contact with) sense antiferromagnetic layer 32. The orientation of the magnetic moment of biasing pinned magnetic structure 28 does not significantly change in response to an external magnetic field (for typical magnitudes of such external magnetic fields). The orientation of biasing pinned magnetic structure 28 causes the magnetic moment of sense biasing ferromagnetic layer 26 to be oriented in a predetermined manner.

Orientation of sense biasing ferromagnetic layer 26 is established by exchange coupling with biasing pinned magnetic structure 28. In some embodiments, reference ferromagnetic layer 21 and sense biasing ferromagnetic layer 26 are pinned in in-plane directions that are parallel to one another. Sense non-magnetic spacer 30 is sandwiched between biasing pinned magnetic structure 28 and sense biasing ferromagnetic layer 26. Coupling between biasing pinned magnetic structure 28 and sense biasing ferromagnetic layer 26 is mediated by RKKY exchange coupling, similar to the exchange interaction described for reference structure 16.

Such a layer structure as shown in FIG. 1 is not to scale, but for the purpose of disclosing an example of layer ordering only. By varying the thickness of sense non-magnetic spacer 30 by mere angstroms the exchange coupling of biasing pinned magnetic structure 28 and sense biasing ferromagnetic layer 26 can oscillate between anti-parallel and parallel. Thickness of sense non-magnetic spacer 30 may be set such that biasing pinned magnetic structure 28 and sense biasing ferromagnetic layer 26 are magnetized antiparallel to one another. For example, thickness of synthetic antiferromagnet non-magnetic spacer can be tuned to 0.7, 0.8, 0.9, 1.0, or 1.1 nm, to provide effective pinning. The optimal thickness of non-magnetic spacer layer 30 can vary depending on the film roughness, defect density, thermal treatment, etc. Thus, the term "synthetic antiferromagnet" is used as there is not a coherent antiferromagnetic atomic layered ordering of moments throughout the entire structure, but a longer range RKKY interaction aligning nanoscale thickness ferromagnetic layers (e.g., in an anti-parallel fashion).

Sense biasing ferromagnetic layer 26, which has a magnetic moment that is oriented as described above, biases sensing ferromagnetic layer 18 of magnetoresistive sensing structure 12, via magnetic exchange coupling. The strength of biasing acting upon sensing ferromagnetic layer 18 can be tuned by varying the thickness of exchange-tuning spacer 24, which is sandwiched between (i.e., in direct contact with each of) sensing ferromagnetic layer 18 and sense biasing ferromagnetic layer 26. Orientation of the magnetic moment of sense biasing ferromagnetic layer 26 determines the orientation of sensing ferromagnetic layer 18 when in an absence of an external magnetic field. Thus, orientation of sense biasing ferromagnetic layer 26 must be established so as to bias sensing ferromagnetic layer 18 in a predetermined fashion.

Again, orientation of the magnetic moment of biasing pinned magnetic structure 28 is pinned via sense antiferromagnetic layer 32. Orientation of the magnetic moment of biasing pinned magnetic structure 28 then determines the orientation of the magnetic moment of sense biasing ferromagnetic layer 26. Orientation of the magnetic moment of sense biasing ferromagnetic layer 26 determines the orientation of the magnetic moment of sensor sensing ferromagnetic layer 18 in the absence of an external magnetic field. In this way, in the absence of an external magnetic field, the magnetic moment of sensing ferromagnetic layer 18 is ultimately oriented by the direction of the exchange interaction occurring between sense antiferromagnetic layer 32 and sense pinned ferromagnetic layer 31. By biasing sensing ferromagnetic layer 18 in such a fashion, the stray magnetic field of sense biasing ferromagnetic layer 26 is largely contained by biasing pinned magnetic structure 28 via dipole coupling. Such dipole coupling between sense biasing ferromagnetic layer 26 and biasing pinned magnetic structure 28 reduces stray magnetic field interactions with sensing ferromagnetic layer 18, especially at the edges of the patterned structures.

Additional layers depicted in FIG. 1 includes substrate 34, seed/adhesion layer 36, and capping layer 38. Synthetic antiferromagnet biased magnetoresistive sensor 10 is typically fabricated upon a suitable substrate material, such as, for example, substrate 34. Seed layer 36 is then deposited upon substrate 34 so as to provide a layer to which reference antiferromagnetic layer 19 can adhere and can provide suitable crystalline texturing to promote desired properties in upper layers. Capping layer 38 is deposited upon the final layer structure of synthetic antiferromagnet biased magnetoresistive sensor 10 so as to passivate the fabricated device against oxidation or other unintended damage. Electrical contacts, which are not depicted in FIG. 1, to synthetic antiferromagnet biased magnetoresistive sensor 10 can be provided either peripherally or vertically. The layer thicknesses, as depicted in FIG. 1, are not to scale. For example, sense non-magnetic spacer 30 and exchange-tuning spacer 24 control exchange coupling therethrough, and thus have well-controlled thicknesses, which typically are measured as single-digit nanometers or less.

Figure 2:
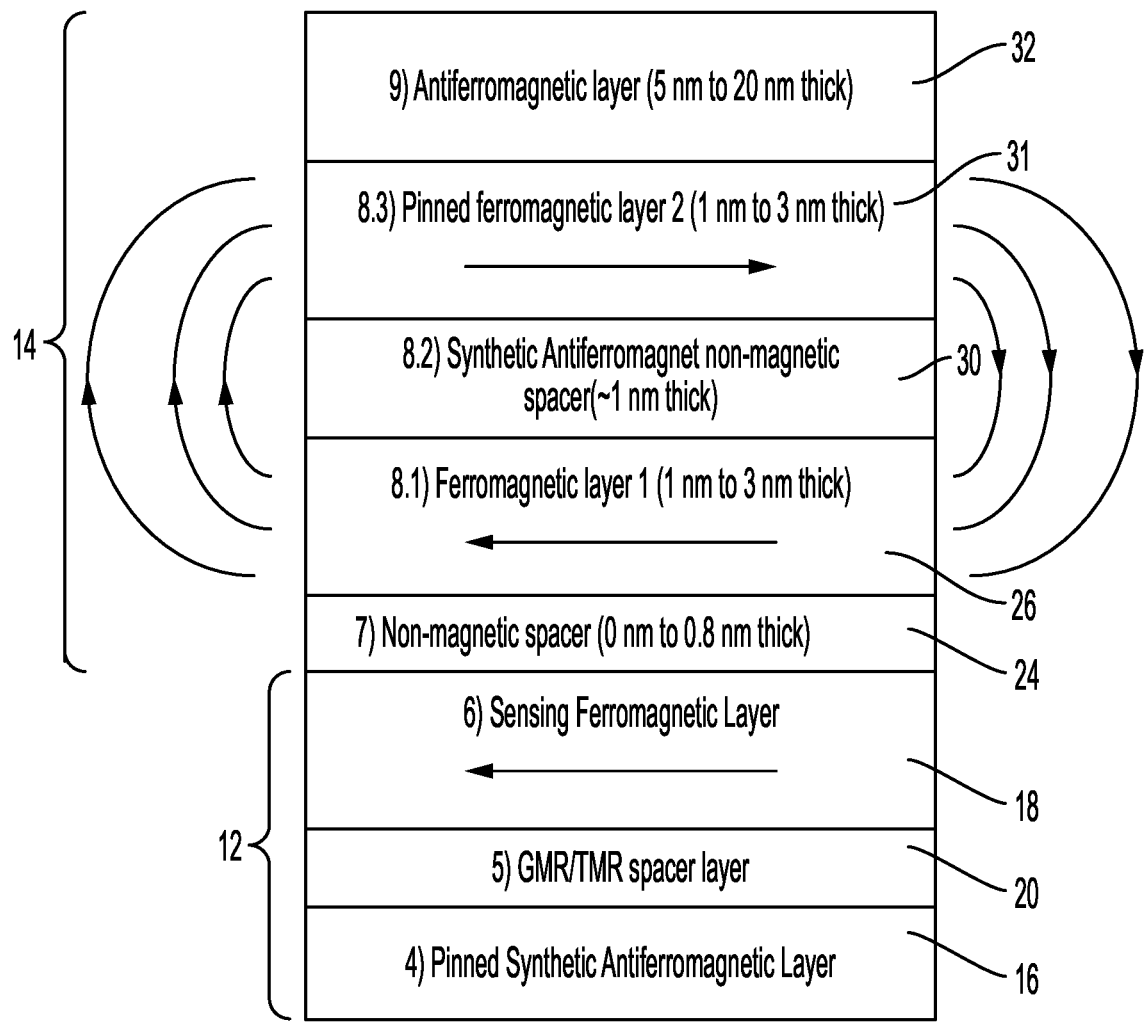
FIG. 2 is a perspective view of a TMR/GMR sensor with synthetic antiferromagnetic biasing depicting a coordinate system used for disclosing magnetic operation of the TMR/GMR sensor.

FIG. 2 is cross-sectional view of a portion of a TMR/GMR sensor with synthetic antiferromagnet biasing. In FIG. 2, magnetoresistive sensing structure 12 and synthetic antiferromagnetic biasing structure 14 of synthetic antiferromagnet biased magnetoresistive sensor 10 are shown annotated with exemplary layer thicknesses. Magnetoresistive sensing structure 12 includes reference structure 16, sensing ferromagnetic layer 18, and spacer layer 20. In the embodiment depicted, reference structure 16 can have a thickness between 5 and 30 nm, spacer layer 20 can have a thickness between 0.4 and 3.0 nm, and sensing ferromagnetic layer 18 can have a thickness between 1 and 10 nm. Because TMR or GMR operation is determined by a thickness and material of spacer layer 20, thickness of spacer layer 20 is less than a mean free path $\lambda$ of electrons between spin-state disrupting scattering events in such a material as is selected. In some embodiments spacer layer 20 can include Cu, Ag, Au and/or binary/ternary alloys of those three materials. In addition to such alloys having low amounts of oxygen content, TMR spacer layers can include predominantly $AlO_x$, MgO and other less used oxide layers, such as ScO. Spacer layers involving carbon or graphene could also be utilized.

Synthetic antiferromagnetic biasing structure 14 includes exchange-tuning spacer 24, sense biasing ferromagnetic layer 26, sense pinned ferromagnetic layer 31, sense non-magnetic spacer 30, and sense antiferromagnetic layer 32. In the embodiment depicted, exchange-tuning spacer 24 has a thickness between 0.0 and 0.8 nm, sense biasing ferromagnetic layer 26 has a thickness between 1 and 3 nm, sense non-magnetic spacer 30 has a thickness on the order of 1 nm, sense pinned ferromagnetic layer 31 has a thickness between 1 and 3 nm, and antiferromagnetic layer 32 has a thickness between 5 and 20 nm. Also annotated in FIG. 2 are magnetic field lines of dipole coupled layers sense biasing ferromagnetic layer 26 and sense pinned ferromagnetic layer 31. Note that these magnetic field lines are localized away from sensing ferromagnetic layer 18 of magnetoresistive sensing structure 12. Exchange-tuning spacer 24 can include thin non-magnetic materials (e.g., <1 nm in thickness) of Ta, Ru and/or MgO. Sense biasing ferromagnetic layer 26 and/or sense pinned ferromagnetic layer 31 are magnetic layers that are typically less than 5 nm thick and can include alloys of Co, Fe, Ni and/or B. Sense pinned ferromagnetic layer 31 could be a bilayer structure with a NiFe alloy (typically a relative composition of 80/20 in atomic percent) adjacent to sense antiferromagnetic layer 32 and a Co, Fe, Ni, B alloy layer adjacent to sense non-magnetic spacer 30. Sense non-magnetic spacer 30 is a non-magnetic metallic layer that can be Ru, Cu, Cr or other alloys that allow a strong/tunable RKKY magnetic exchange interaction between sense pinned ferromagnetic layer 31 and sense biasing ferromagnetic layer 26. Sensing ferromagnetic layer 18 can consist of either a monolayer or bilayer ferromagnetic material composed of Co, Fe, Ni, and B alloys, as well as several types of Heusler alloys containing, for instance, Al, Si, Ga, or Ge and other transition metals.

The pinning orientation imparted onto sense pinned ferromagnetic layer 31 by sense antiferromagnetic layer 32, may not be aligned parallel to the pinning orientation imparted onto reference pinned ferromagnetic layer 23 by reference antiferromagnet layer 19. Relative alignment of the two synthetic antiferromagnetic biasing structures can be controlled through the fabrication process and/or tailored materials property selection. For instance, by means of carefully controlled composition, thickness, crystalline texture, and materials choice of the antiferromagnetic layers and other layers adjacent thereto. Thus, the pinning orientations imparted on sense pinned ferromagnetic layer 31 and reference pinned ferromagnetic layer 23, and by extension the exchange bias imparted on sensing ferromagnetic layer 18 and reference ferromagnetic layer 21, could be set into multiple possible configurations as demonstrated below.

Figure 3A:
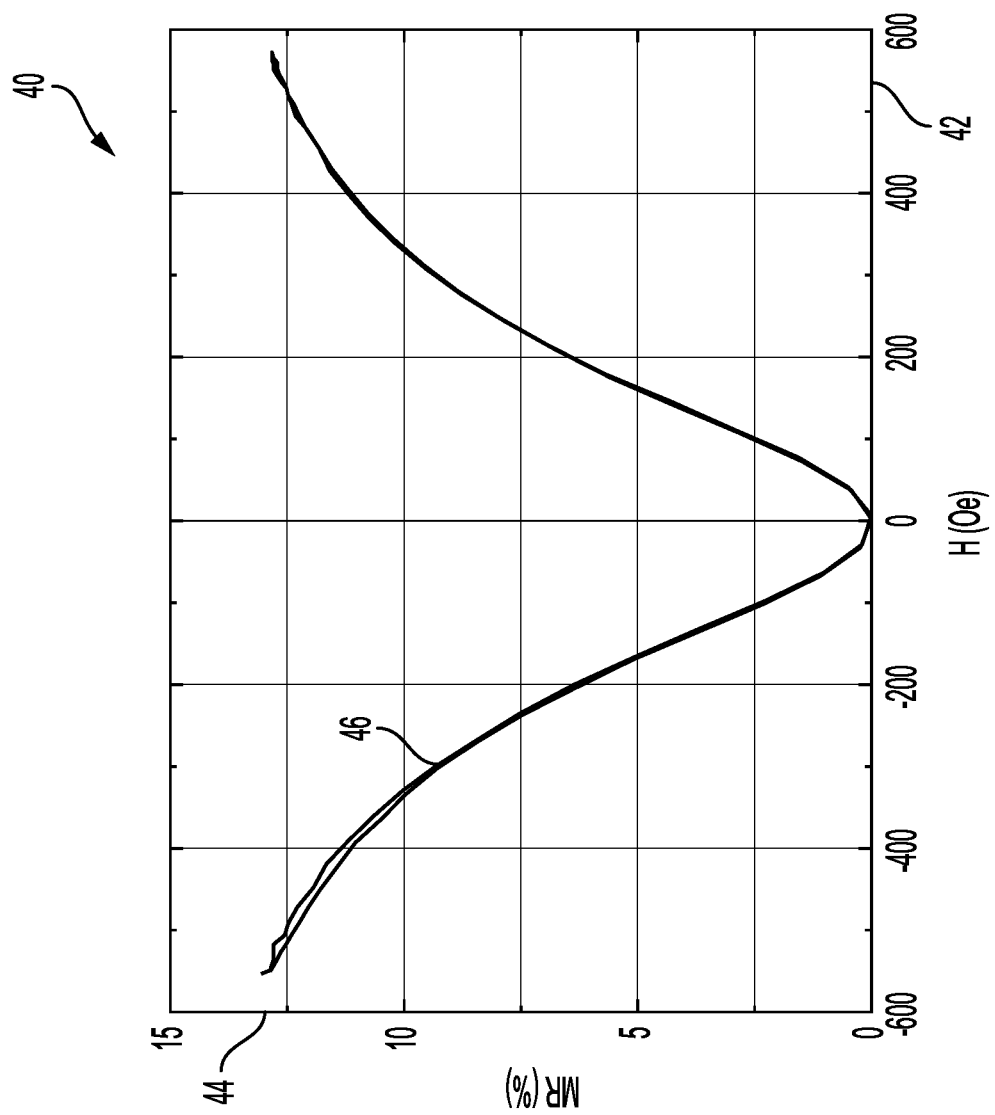
FIGS. 3A-3B are graphs of magnetoresistance of a TMR/GMR sensor with synthetic antiferromagnetic biasing configured to provide a first biasing configuration.
Figure 3B:
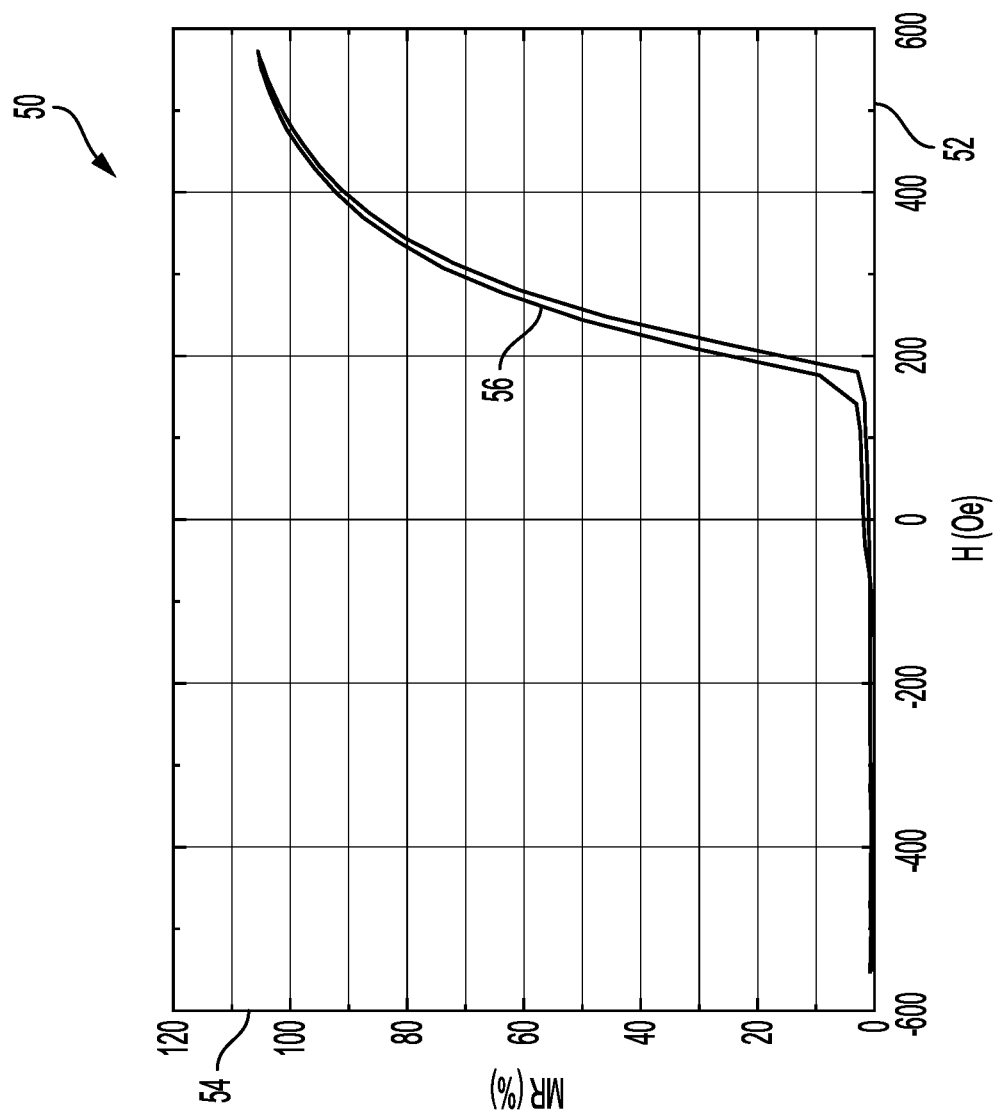

FIGS. 3A-3B are graphs of magnetoresistance of a TMR/GMR sensor with synthetic antiferromagnetic biasing configured to provide a first biasing configuration. In FIGS. 3A-3B, graphs 40 and 50 depict magnetoresistive (MR) responses to an applied field for synthetic antiferromagnet biased magnetoresistive sensor 10, in which the magnetic moments of reference ferromagnetic layer 21 and sensing ferromagnetic layer 18 are parallel to one another (in the x-y plane). In graphs 40 and 50, horizontal axes 42 and 52, respectively, are indicative of the magnitude and direction (e.g., positive, or negative) of the external applied magnetic field. In graphs 40 and 50, vertical axes, 44 and 54, respectively, are indicative of the MR response to the external magnetic field.

In FIG. 3A, graph 40 depicts the MR response 46 to an external magnetic field applied orthogonal to the directions of the magnetic moments of reference ferromagnetic layer 21 and sensing ferromagnetic layer 18. As depicted in FIG. 3A, the MR response 46 to external magnetic field directions orthogonal to a pinning direction of both reference ferromagnetic layer 21 and sense biasing ferromagnetic layer 26 is unipolar and symmetric (i.e., has even symmetry about the origin or zero-bias condition), increasing its resistance as the magnitude of the orthogonal external field increases. This MR response 46 indicates that as the magnitude of the external field increases, the percentage of electrons within sensing ferromagnetic layer 18 having electron spin aligned with the magnetic moment of reference ferromagnetic layer 21 decreases. Such a response can be useful for unipolar switching applications where only a metric of the magnitude of the external magnetic field is desired.

In FIG. 3B, graph 50 depicts the MR response 56 to an external magnetic field antiparallel to the directions of the magnetic moments of reference ferromagnetic layer 21 and sensing ferromagnetic layer 18. As depicted in FIG. 3B, the MR response 56 is asymmetric, increasing its resistance as the external magnetic field increases in the antiparallel direction (e.g., the positive polarity), but saturating as the external magnetic field increases in the parallel direction (e.g., the negative polarity). This MR response 56 indicates that as the external field increases in the antiparallel direction, the percentage of electrons within sensing ferromagnetic layer 18 having electron spin oriented with the magnetic moment of reference ferromagnetic layer 21 decreases, but as the external field increases in the parallel direction, the percentage of electrons within sensing ferromagnetic layer 18 having electron spin oriented with the magnetic moment of reference ferromagnetic layer 21 increases. Such a response can be useful for bipolar switching applications where a metric of the direction of the external magnetic field is desired.

Figure 4A:
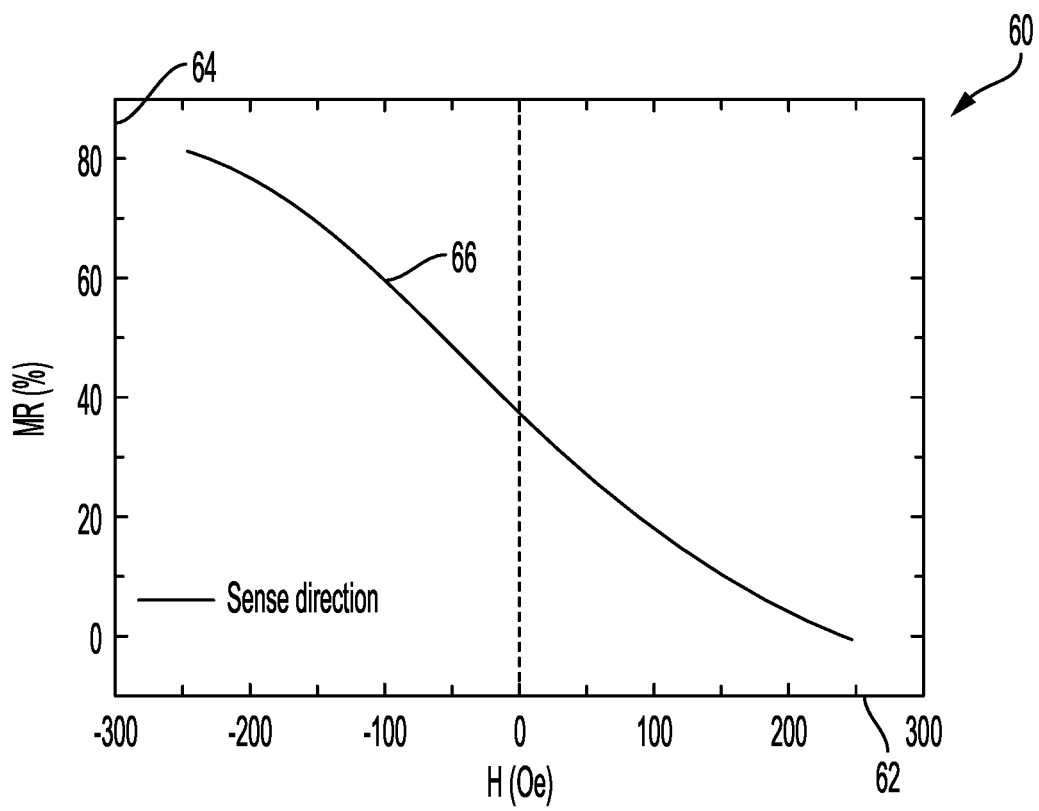
FIGS. 4A-4B are graphs of magnetoresistance of a TMR/GMR sensor with synthetic antiferromagnetic biasing configured to provide a second biasing condition.
Figure 4B:
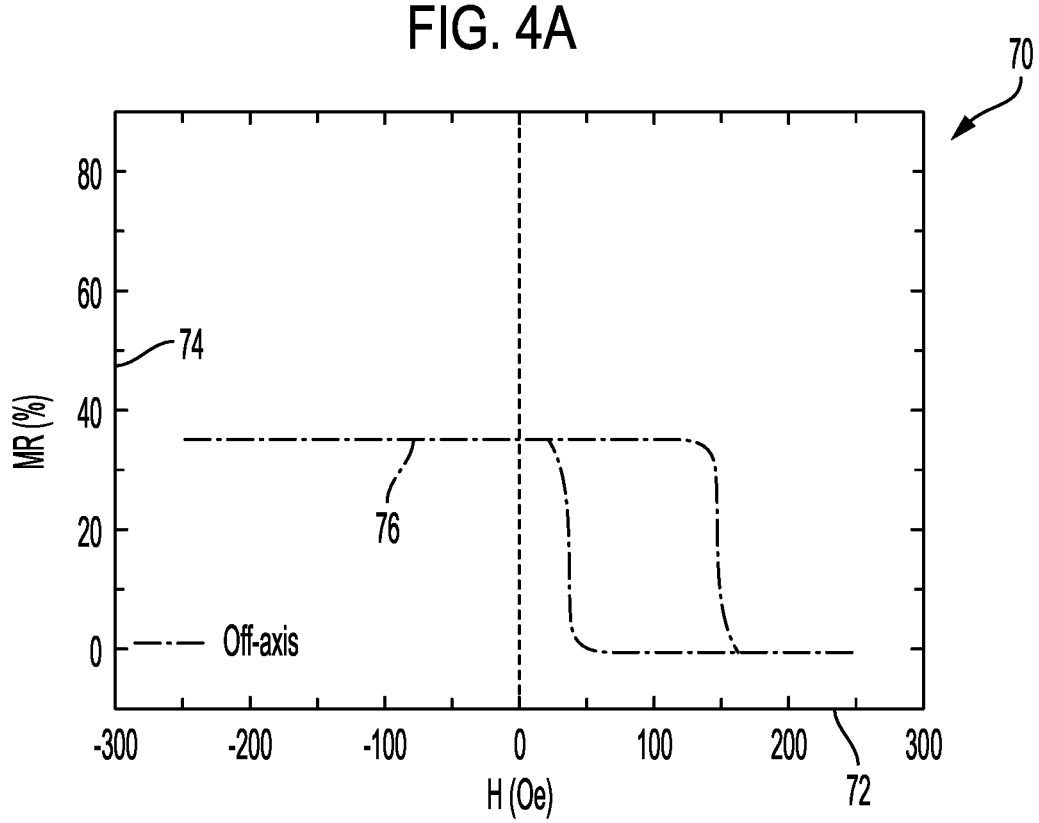

FIGS. 4A-4B are graphs of magnetoresistance of a TMR/GMR sensor with synthetic antiferromagnetic biasing configured to provide a second biasing condition. In FIGS. 4A-4B, graphs 60 and 70 depict MR responses of synthetic antiferromagnet biased magnetoresistive sensor 10, in which the magnetic moments of reference ferromagnetic layer 21 and sensing ferromagnetic layer 18 are orthogonal to one another (in the x-y plane). In graphs 60 and 70, horizontal axes 62 and 72, respectively, are indicative of the magnitude and direction (e.g., positive, or negative) of the external magnetic field. In graphs 60 and 70, vertical axes, 64 and 74, respectively, are indicative of the MR response to the external magnetic field.

In FIG. 4A, graph 40 depicts the MR response 66 to an external magnetic field applied parallel to the direction of the magnetic moment of reference ferromagnetic layer 21 and orthogonal to the direction of the magnetic moment of sensing ferromagnetic layer 18. As depicted in FIG. 4A, the MR response 66 exhibits low hysteresis over a large span of the external magnetic field (i.e., the difference between the response to an external field changing in opposite directions is less than 2%, 3%, 5% of the total response) decreasing its resistance as the magnitude of the orthogonal external field increases in the direction of the magnetic moment of reference ferromagnetic layer 21. This MR response 66 indicates that as the magnitude of the external field increases, the percentage of electrons within sensing ferromagnetic layer 18 having electron spin oriented with the magnetic moment of reference ferromagnetic layer 21 increases. Such a response can be useful for switching applications where metrics of both the magnitude and the direction of the external magnetic field are desired.

In FIG. 4B, graph 70 depicts the MR response 76 to an external magnetic field applied parallel with an easy axis of sense layer 18. As depicted in FIG. 4B, the MR response 76 exhibits hysteresis and is biased away from the origin, Furthermore, the MR response is relatively insensitive to changes in the magnetic field outside of the hysteresis. This configuration can permit a bipolar linear response of the material along the sense direction (depicted in FIG. 4A). Usefully, the biasing structure restricts the sensor to have only one permitted configuration at zero applied field. Without the biasing structure, the loop delineated in FIG. 4B would be centered at zero applied field H=0 Oe, thereby permitting either a high-resistance or low-resistance state to form. In such an unbiased configuration, the resulting resistance of the sensor at zero applied field would be determined by the specific history of the external field applied along the sensor's off-axis.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the particular embodiment(s) disclosed, but that the invention will include all embodiments falling within the scope of the appended claims.

The invention claimed is:

1. A magnetoresistive sensor element with synthetic antiferromagnet biasing, the magnetoresistive sensor element comprising:
   a reference structure including:
      a reference ferromagnetic layer; and
      a reference antiferromagnetic layer in direct contact with a reference pinned ferromagnetic layer,
      wherein the reference pinned ferromagnetic layer is formed on an opposite side of a reference non-magnetic spacer from the reference ferromagnetic layer;
   a GMR/TMR sensor including:
      a sensing ferromagnetic layer formed on an opposite side of a spacer layer from the reference ferromagnetic layer of the reference structure;
   a synthetic antiferromagnetic biasing structure including:
      a biasing pinned magnetic structure formed on an opposite side of a sense non-magnetic spacer from a sense biasing ferromagnetic layer; and
   an exchange-tuning spacer sandwiched between the sensing ferromagnetic layer of the GMR/TMR sensor and the sense biasing ferromagnetic layer of the synthetic antiferromagnetic biasing structure,
   wherein the reference ferromagnetic layer and the sense biasing ferromagnetic layer are pinned in in-plane directions that are parallel to one another.

2. The magnetoresistive sensor element of claim 1, wherein the biasing pinned magnetic structure includes:
   a sense pinned ferromagnetic layer; and
   a sense antiferromagnetic layer in direct contact with the sense pinned ferromagnetic layer, wherein the sense pinned ferromagnetic layer is formed on the opposite side of the sense non-magnetic spacer from the sense biasing ferromagnetic layer, and wherein the sense biasing ferromagnetic layer is in direct contact with the exchange-tuning spacer.

3. The magnetoresistive sensor element of claim 1, wherein the biasing of the sensing ferromagnetic layer is such that the magnetoresistance of the magnetoresistive sensor element is unipolar and symmetric about a zero-bias condition in response to external magnetic field directions orthogonal to a pinning direction of both the reference ferromagnetic layer and the sense biasing ferromagnetic layer.

4. The magnetoresistive sensor element of claim 1, wherein the biasing of the sensing ferromagnetic layer is such that the magnetoresistance of the magnetoresistive sensor element is asymmetric about a zero-bias condition in response to external magnetic field directions parallel to the pinning direction of both the reference ferromagnetic layer and the sense biasing ferromagnetic layer.

5. The magnetoresistive sensor element of claim 1, wherein the spacer layer comprises an insulative spacer.

6. The magnetoresistive sensor element of claim 1, wherein the spacer layer comprises a conductive spacer.

7. The magnetoresistive sensor element of claim 1, wherein a difference between the blocking temperatures of reference structure and synthetic antiferromagnetic biasing structure is greater than 30° C.

8. The magnetoresistive sensor element of claim 1, wherein the sense non-magnetic spacer has a thickness tuned such that a Ruderman-Kittel-Kasuya-Yoshida (RKKY) exchange coupling between the sense pinned ferromagnetic layer and the sense biasing ferromagnetic layer ensures that, in the absence of an external field, magnetic moment of the sense biasing ferromagnetic layer is antiparallel with a magnetization direction of the sense pinned ferromagnetic layer.

9. The magnetoresistive sensor element of claim 8, wherein the thickness of the sense non-magnetic spacer is between 0.5 and 2 nm.

10. A magnetoresistive sensor element with synthetic antiferromagnet biasing, the magnetoresistive sensor element comprising:
    a reference structure including:
        a reference ferromagnetic layer; and
        a reference antiferromagnetic layer in direct contact with a reference pinned ferromagnetic layer,
            wherein the reference pinned ferromagnetic layer is formed on an opposite side of a reference non-magnetic spacer from the reference ferromagnetic layer;
    a GMR/TMR sensor including:
        a sensing ferromagnetic layer formed on an opposite side of a spacer layer from the reference ferromagnetic layer of the reference structure;
    a synthetic antiferromagnetic biasing structure including:
        a biasing pinned magnetic structure formed on an opposite side of a sense non-magnetic spacer from a sense biasing ferromagnetic layer; and
    an exchange-tuning spacer sandwiched between the sensing ferromagnetic layer of the GMR/TMR sensor and the sense biasing ferromagnetic layer of the synthetic antiferromagnetic biasing structure,
    wherein the reference ferromagnetic layer and the sense biasing ferromagnetic layer are pinned in in-plane directions that are orthogonal to one another, wherein the biasing of the sensing ferromagnetic layer is such that the magnetoresistance of the magnetoresistive sensor element has hysteresis resulting in less than a 5% response difference and is symmetric about the zero-bias condition of the external magnetic field directed orthogonal to a pinning direction of the biasing pinned ferromagnetic layer.

11. The magnetoresistive sensor element of claim 10, wherein the biasing of the sensing ferromagnetic layer is such that the magnetoresistance of the magnetoresistive sensor element is asymmetric about a zero-bias condition in response to external magnetic field directions parallel to the pinning direction of the sense biasing ferromagnetic layer.

12. A method of manufacturing a synthetic antiferromagnet biased magnetoresistive sensor, the method comprising:
    depositing a reference structure that includes:
        depositing a seed or adhesion layer directly on a substrate;
        depositing a reference antiferromagnet layer on the seed layer;
        depositing a reference pinned ferromagnetic layer upon the reference antiferromagnetic layer;
        depositing a synthetic antiferromagnet non-magnetic spacer upon the reference pinned ferromagnetic layer; and
        depositing a reference ferromagnet upon the synthetic antiferromagnet non-magnetic spacer;
    depositing a spacer layer upon the reference structure;
    depositing a sensing ferromagnetic layer on the spacer layer;
    depositing an exchange-tuning spacer on the sensing ferromagnetic layer;
    depositing a sense biasing ferromagnetic layer on the exchange-tuning spacer;
    depositing a sense non-magnetic spacer on the sense biasing ferromagnetic layer;
    depositing a biasing pinned magnetic structure on the sense non-magnetic spacer; and
    depositing a biasing pinned magnetic structure on the sense non-magnetic spacer; and
    depositing a capping layer on the biasing pinned magnetic structure,
    wherein the reference ferromagnetic layer and the sense biasing ferromagnetic layer are pinned in in-plane directions that are parallel to one another.

13. The method of claim 12, wherein the reference pinned ferromagnetic layer is fixed in orientation by providing an external magnetic field while reducing the temperature of the reference antiferromagnetic structure below the blocking temperature of the reference antiferromagnetic structure.

14. The method of claim 12, wherein depositing a biasing pinned magnetic structure includes:
    depositing a sense pinned ferromagnetic layer on the non-magnetic spacer; and
    depositing a sense antiferromagnetic layer on the sense pinned ferromagnetic layer.

15. The method of claim 14, wherein the sense pinned ferromagnetic layer is fixed in orientation by providing an external magnetic field while reducing the temperature of the synthetic antiferromagnetic biasing structure below the blocking temperature of synthetic antiferromagnetic biasing structure.

16. The method of claim 15, wherein a difference between the blocking temperatures of reference structure and synthetic antiferromagnetic biasing structure is greater than 30° C.

* * * * *